US012146911B1

(12) United States Patent
Srinivasan et al.

(10) Patent No.: US 12,146,911 B1
(45) Date of Patent: Nov. 19, 2024

(54) TVF TRANSITION COVERAGE WITH SELF-TEST AND PRODUCTION-TEST TIME REDUCTION

(71) Applicant: STMicroelectronics International N.V., Geneva (CH)

(72) Inventors: Venkata Narayanan Srinivasan, Greater Noida (IN); Manish Sharma, Gurgaon (IN); Jeena Mary George, Kattappana (IN); Umesh Chandra Srivastava, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 15 days.

(21) Appl. No.: 18/203,345

(22) Filed: May 30, 2023

(51) Int. Cl.
G01R 31/3185 (2006.01)
(52) U.S. Cl.
CPC ........... *G01R 31/318541* (2013.01); *G01R 31/318536* (2013.01); *G01R 31/318552* (2013.01); *G01R 31/318555* (2013.01); *G01R 31/318572* (2013.01)
(58) Field of Classification Search
CPC .... G01R 31/318541; G01R 31/318536; G01R 31/318552; G01R 31/318555; G01R 31/318572
See application file for complete search history.

(56) References Cited

U.S. PATENT DOCUMENTS

| 7,461,307 | B2 | 12/2008 | Gunda et al. |
| 8,928,378 | B2 | 1/2015 | Wu |
| 9,188,640 | B1* | 11/2015 | Jajodia ........... G01R 31/318541 |
| 9,297,855 | B1 | 3/2016 | Jindal et al. |
| 10,151,797 | B2 | 12/2018 | Srinivasan et al. |
| 11,016,145 | B1 | 5/2021 | Lesser et al. |
| 11,128,282 | B2 | 9/2021 | Deligiannis et al. |
| 2013/0055040 | A1* | 2/2013 | Kimura .......... G01R 31/318541 714/E11.155 |
| 2017/0301667 | A1* | 10/2017 | Or-Bach .......... H03K 19/17728 |
| 2023/0079823 | A1 | 3/2023 | Ooigawa et al. |

FOREIGN PATENT DOCUMENTS

CN 111525919 A 8/2020

OTHER PUBLICATIONS

EENews Europe "Method for Safety Compliant Triple Voting Flop Implementation," Freescale Semiconductors India Pvt. Ltd, Nov. 30, 2014, 2 pages.

* cited by examiner

*Primary Examiner* — Cynthia Britt
*Assistant Examiner* — Jeffrey Andrew Yang
(74) *Attorney, Agent, or Firm* — Slater Matsil, LLP

(57) ABSTRACT

According to an embodiment, a method for testing a triple-voting flop (TVF) is provided. The method includes providing a first and a second scan enable signal by a control circuit to, respectively, a first scan flip-flop and a third scan flip-flop of the TVF; receiving a third scan enable signal at the second scan flip-flop of the TVF; providing a scan input signal to the first scan flip-flop, the second scan flip-flop, and the third scan flip-flop; controlling the first scan enable signal, the second scan enable signal, and the third scan enable signal; receiving, at an output of the TVF, a scan output signal; and determining whether the TVF suffers from a fault based on the scan output signal and the controlling of the first scan enable signal, the second scan enable signal, and the third scan enable signal.

20 Claims, 8 Drawing Sheets

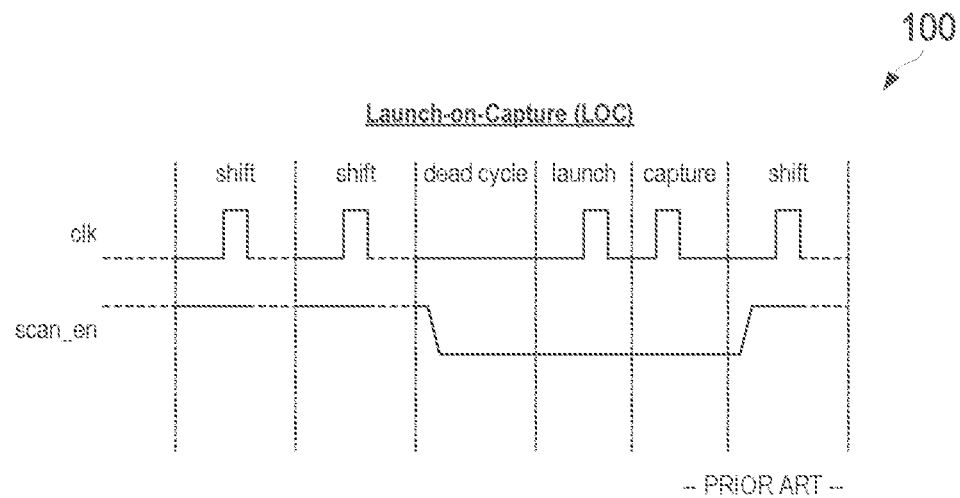
FIG. 1 — PRIOR ART —
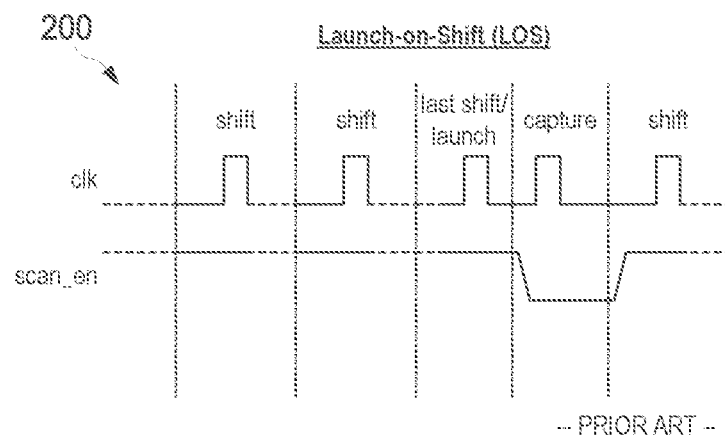
FIG. 2 — PRIOR ART —
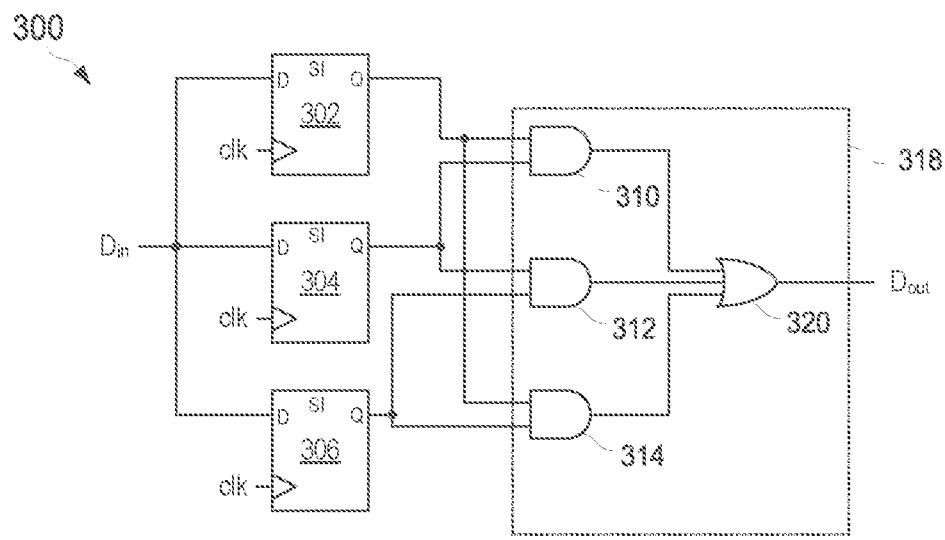
FIG. 3

-- PRIOR ART --

TVF TRANSITION COVERAGE WITH SELF-TEST AND PRODUCTION-TEST TIME REDUCTION

TECHNICAL FIELD

The present disclosure generally relates to design for test and, in particular embodiments, to at-speed scan coverage for triple voting logic.

BACKGROUND

Integrated circuits (ICs) are generally tested for faults. In particular, the logic circuits of the integrated circuit are commonly tested using a method often referred to as scan testing. During scan testing, test patterns are shifted in through one or more chains of flip-flops (i.e., scan chains) to stimulate one or more logic circuits. Results from the stimulated logic circuits are loaded into the scan chains and are shifted out for evaluation. When the shifted-out patterns match expected patterns (based on the proper functioning of one or more logic circuits), no faults are detected, and the circuit may be defect-free. Faults are detected when the shifted-out patterns do not match the expected patterns.

FIG. 1 shows exemplary launch-on-capture (LOC) waveforms 100 of the scan chain clock signal (clk) and scan-enable signal (scan_en). In response to the scan-enable signal being asserted (e.g., logic level high), data (e.g., test vectors, test patterns, vectors, or patterns) shifts into the scan chain at each clock signal pulse. In response to the scan-enable signal being de-asserted (e.g., logic level low), the first pulse of the clock signal causes the logic circuits with inputs coupled to the scan chain to transition into a step generally referred to as launch. The second pulse of the clock signal causes the loading of the outputs of the stimulated logic circuits into flip-flops of the scan chain. The data shifted out is then evaluated for faults.

Launch-on-capture may be performed at-speed to test the logic circuits for faults related to transition delays. At-speed scan coverage refers to the effectiveness of scan testing techniques in detecting faults or errors in digital circuits when they are operating at their maximum clock frequency or their intended operational speed. It is a measure of how well the scan testing technique can detect faults under realistic operating conditions.

Launch-on-capture testing allows for slowly shifting data into or out of the scan chain while still performing at-speed testing of the logic circuits. Thus, in some implementations, launch-on-capture testing may allow for easier implementation of the scan circuit (compared with launch-on-shift testing) since the scan-enable signal transition may be slow.

FIG. 2 shows exemplary launch-on-shift (LOS) waveforms 200 of the scan chain clock and scan-enable signals. In launch-on-shift testing, the launch operation is performed during the last shift pulse of the clock signal. The scan-enable signal transitions to the low state after the clock signal's last shift pulse but before the clock signal's capture pulse.

Similar to launch-on-capture testing, launch-on-shift testing may be performed at-speed. Thus, in some implementations, the scan-enable signal implementation is designed to transition fast enough to allow for at-speed testing during launch-on-shift. In some implementations, launch-on-shift testing may allow for lower test time (compared with launch-on-capture testing) since launch-on-shift testing uses the clock pulse for the last shift for both shifting data through the scan chain and for the launch operation.

Scan testing (e.g., with implementations as illustrated in FIGS. 1 and 2) may be implemented in an automated test equipment (ATE), where the ATE provides, for example, the test vectors to the integrated circuit and evaluates the results (data shifted out) for determining faults. Scan testing may also be performed as a logic built-in self-test (LBIST). The integrated circuit applies the test vectors to itself (e.g., using a pseudorandom number generator) and determines whether a fault occurred using an integrated circuit LBIST controller. Scan testing or the performance of LBIST may provide a way of detecting the presence of faults.

In some applications, a circuit is expected to continue proper operation even in the presence of a fault. In such applications, a redundancy circuit may be used. This is typically true for safety-sensitive automotive applications. Security features may also demand logic redundancy around critical bits (e.g., to prevent adversary attacks). A redundancy circuit may be understood as a fault-tolerant circuit in which the circuit can continue and properly operate in the presence of a fault.

FIG. 3 illustrates a schematic of an exemplary triple-voting flop (TVF) 300, an example of a redundancy circuit. Triple-voting flop 300 includes a first D-flip-flop 302 (Reg A), a second D-flip-flop 304 (Reg B), and a third D-flip-flop 306 (Reg C), and voting circuit 318. Voting circuit 318 includes AND gates 310, 312, and 314, and OR gate 320.

The logic for the triple-voting flop 300 can be inserted at the synthesis/gate level using, for example, a connect-disconnect script. The connect-disconnect script can be easily updated to include additional logic gates. Further, the scan inputs on the terminals of the triple-voting flop 300 can be extracted using the connect-disconnect script and used for gating.

Triple-voting flop 300 is a type of triple-voting logic that uses a fault-tolerant design technique commonly used in safety-critical systems. Three redundant versions of a circuit are implemented and their outputs are compared to detect and mitigate potential errors. The at-speed scan coverage for triple voting logic refers to the ability of the scan testing technique to detect faults in such redundant circuits when operating at their maximum clock frequency. Triple-voting flop 300 may replace a D-flip-flop where redundancy is desired.

The at-speed scan coverage for triple voting logic can vary depending on several factors, including the specific implementation of the triple voting logic, the complexity of the circuit, the test patterns used, and the quality of the manufacturing process. It is typically evaluated through extensive simulations and testing to ensure that the redundant circuits are properly tested and faults can be detected at the intended operating speed.

Achieving high at-speed scan coverage for triple voting logic can be challenging due to the increased complexity of the design and the potential for subtle faults that may only manifest themselves under specific conditions. Therefore, comprehensive testing methodologies, including advanced fault models and test patterns, are often employed to maximize the coverage and effectiveness of at-speed scan testing for triple voting logic.

Triple-voting flop 300 uses majority voting to determine the output ($D_{out}$). For example, when all D-flip-flops 302, 304, and 306 are operating properly, the content of each of D-flip-flops 302, 304, and 306 is the same, and the output ($D_{out}$) is equal to the content of D-flip-flops 302, 304, and 306. If one of D-flip-flops 302, 304, or 306 outputs a wrong state, output ($D_{out}$) continues to output the correct value (since the two other D-flip-flops of D-flip-flops 302, 304, and 306 output the correct value).

For example, if the first D-flip-flop 302 and the second D-flip-flop 304 output a logic '1' and the third D-flip-flop 306 flips and outputs a logic '0', the output of AND gate 310 is a logic '1', the output of each of AND gates 312 and 314 is a logic '0', and the output of OR gate 320 is a logic '1'. If the first D-flip-flop 302 and the second D-flip-flop 304 output a logic '0' and the third D-flip-flop 306 flips and outputs a logic '1', the output of AND gates 310, 312, and 314 is a logic '0', and the output of OR gate 320 is a logic '0'.

Conventionally, triple-voting flops suffer from incomplete at-speed scan coverage. For example, the launch-on-capture testing suffers from large untested nodes. As another example, launch-on-shift testing requires at-speed routing of the scan-enable signal, which is not easily achievable for the entire integrated circuit. A method, circuit, and system to test triple-voting flops with improved time reduction for self-test and production-test are desirable.

SUMMARY

Technical advantages are generally achieved by embodiments of this disclosure which describe an improved at-speed scan coverage for triple voting logic.

A first aspect relates to an integrated circuit. The integrated circuit includes a control circuit and a triple-voting flop. The control circuit includes a first flip-flop, a second flip-flop, a first OR gate, and a second OR gate. An output of each flip-flop is coupled to its respective input. A reset terminal of each flip-flop is configured to receive a scan mode signal. A scan in terminal of the first flip-flop is configured to receive a scan in signal. A first input of the first OR gate is coupled to the output of the first flip-flop. A second input of the first OR gate is coupled to a scan enable signal. A first input of the second OR gate is coupled to the output of the second flip-flop. A second input of the second OR gate is coupled to the scan enable signal. And, the output of the first flip-flop is coupled to scan in terminal of the second flip-flop. The triple-voting flop includes N number of scan flip-flops, N being an odd number greater than or equal to 3. The N scan flip-flops include a first scan flip-flop, a second scan flip-flop, and a third scan flip-flop. The first scan flip-flop has an output coupled to a scan input of the second scan flip-flop and a scan enable input coupled to an output terminal of the first OR gate of the control circuit. The third scan flip-flop has a scan input coupled to an output of the second scan flip-flop and a scan enable input coupled to an output terminal of the second OR gate of the control circuit. The control circuit configured to control the scan enable input of the first scan flip-flop and the scan enable input of the third scan flip-flop based on the scan enable signal and the scan mode signal.

A second aspect relates to an integrated circuit. The integrated circuit includes a control circuit, a triple-voting flop, a scan chain, and a scan controller. The control circuit is configured to provide a first scan enable signal and a second scan enable signal. The triple-voting flop includes a first scan flip-flop, a second scan flip-flop, and a third scan flip-flop. An output of the first scan flip-flop is coupled to a scan input of the second scan flip-flop. An output of the second scan flip-flop is coupled to a scan input of the third scan flip-flop. The scan chain is configured to receive the first scan enable signal, the second scan enable signal, and a third scan enable signal. The scan chain includes the first scan flip-flop, the second scan flip-flop, and the third scan flip-flop. The first scan flip-flop is configured to receive the first scan enable signal. The second scan flip-flop is configured to receive the third scan enable signal. And, the third scan flip-flop is configured to receive the second scan enable signal. The scan controller is coupled to the control circuit and the triple-voting flop. The scan controller is configured to control the first scan enable signal, the second scan enable signal, and the third scan enable signal.

A third aspect relates to a method for testing a triple-voting flop in a scan chain of an integrated circuit. The method includes providing, by a control circuit of the integrated circuit, a first scan enable signal and a second scan enable signal; receiving, by a first scan flip-flop of the triple-voting flop, the first scan enable signal; receiving, by a second scan flip-flop of the triple-voting flop, a third scan enable signal, an output of the first scan flip-flop coupled to a scan input of the second scan flip-flop; receiving, by a third scan flip-flop of the triple-voting flop, the second scan enable signal, an output of the second scan flip-flop coupled to a scan input of the third scan flip-flop; providing a scan input signal to the first scan flip-flop, the second scan flip-flop, and the third scan flip-flop; controlling, by a scan controller of the integrated circuit, the first scan enable signal, the second scan enable signal, and the third scan enable signal; receiving, at an output of the triple-voting flop, a scan output signal; and determining whether the triple-voting flop suffers from a fault based on the scan output signal and the controlling of the first scan enable signal, the second scan enable signal, and the third scan enable signal.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 1 shows exemplary launch-on-capture (LOC) waveforms of the scan chain clock signal and scan-enable signal;

FIG. 2 shows exemplary launch-on-shift (LOS) waveforms of the scan chain clock and scan-enable signals;

FIG. 3 is a schematic of an exemplary triple-voting flop (TVF);

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a triple-voting flop capable of improved scan coverage for automotive applications, it should also be appreciated that these inventive aspects may also apply to other types of voting flops, such as N-voting flops (N being an odd number greater than three). In particular, aspects of this disclosure may similarly apply to applications other than automotive, such as industrial, space, or any other application that could benefit from an improved scan coverage of a voting flop.

The number of triple-voting flops (TVF) in automotive applications is increasing due to the automotive safety integrity level (ASIL) risk classification scheme and automotive security requirements. Automotive industry experts have estimated that 5 to 8% of all design flip-flops will be converted to triple-voting flops. Considering a 5% triple-voting flop penetration, the scan test time is increased by 10%.

Embodiments of this disclosure provide an improved scan coverage (e.g., 100% at-speed scan coverage) for a triple-voting flop without additional physical design constraints, minimal area overhead, and no additional flow updates with the control logic of the triple-voting flop. In embodiments, a pair of OR gates are added for testing all triple-voting flops. Aspects of this disclosure provide an improved test scheme where the number of shift cycles per triple-voting flop is decreased from the typical three scan shift cycles. These and further details are discussed in greater detail below.

Figure 4:
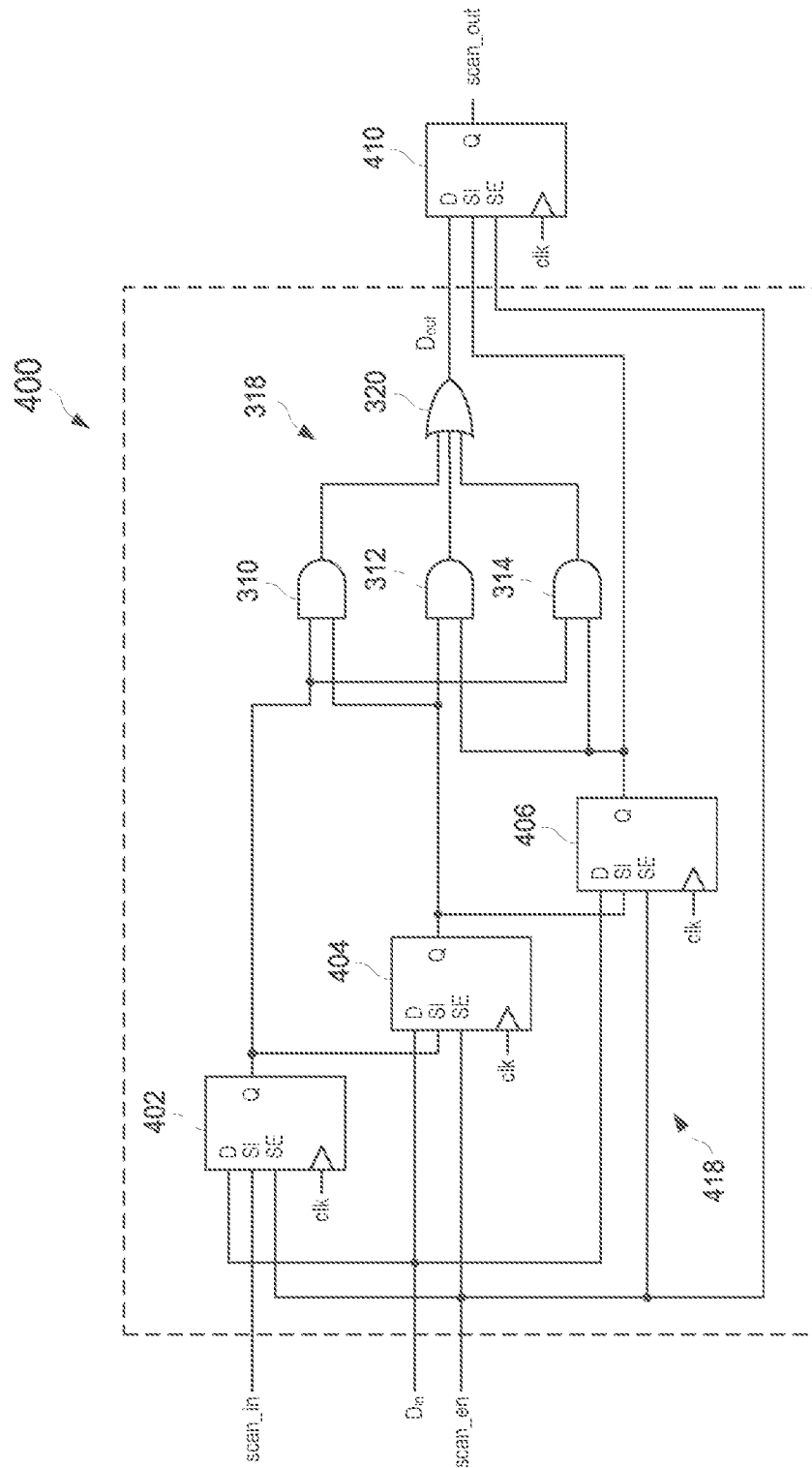
FIG. 4 is a schematic of an exemplary triple-voting flop using scan flip-flops.

FIG. 4 illustrates a schematic of an exemplary triple-voting flop 400 using scan flip-flops. Triple-voting flop 400 is structurally similar to triple-voting flop 300. Triple-voting flop 400, however, replaces the first D-flip-flop 302, the second D-flip-flop 304, and the third D-flip-flop 306, respectively, with a first scan flip-flop 402, a second scan flip-flop 404, and a third scan flip-flop 406. In addition, a fourth scan flip-flop 410 is included to capture the output of the first OR gate 320.

The scan flip-flops 402, 404, 406, and 410 are coupled to form a portion of a scan chain 420. An additional scan flip-flop 410 is used to capture the output of the OR gate 320. As shown in FIG. 4, scan flip-flops 402, 404, 406, and 410 are connected to form a portion of scan chain 418.

For each scan flip-flop, when a scan enable signal (scan_en) is de-asserted (e.g., logic level low) at a scan enable input (SE), the scan flip-flop latches the content of the data input signal (Din) at the data input (D) and outputs the latched content at the output (Q) at each clock pulse of the clock signal (clk) at a clock input of the scan flip-flop. When the scan enable signal (scan_en) is asserted (e.g., logic level high) at the scan enable input (SE), the scan flip-flop latches the content of the scan input signal (scan_in) at the scan in input (SI) and outputs the latched content at the output (Q) at each clock pulse of the clock signal (clk) at the clock input of the scan flip-flop. In normal operating modes, the scan enable signal (scan_en) is de-asserted and the triple-voting flop 400 operates similarly to the triple-voting flop 300.

In launch-on-capture testing and in scan mode, during a shift pulse, test patterns are first loaded using the scan input signal (scan_in) into the first scan flip-flop 402, the second scan flip-flop 404, and the third scan flip-flop 406. During a launch pulse, the first scan flip-flop 402, the second scan flip-flop 404, and the third scan flip-flop 406 latch the same content of the data input signal (Din) and output a respective output (Q). During a capture pulse, the output of the OR gate 320 is captured by the fourth scan flip-flop 410, which is then shifted out with further shift pulses and compared with an expected output to determine whether the triple-voting flop 400 includes faults.

Disadvantageously, the launch-on-capture testing shown in FIG. 4 does not provide complete at-speed scan coverage (fault coverage of about 30%). For example, a slow-to-rise fault may be undetectable at the first scan flip-flop 402 during at-speed scan testing. In particular, during the shift pulse, to test a slow-to-rise fault at the output of the first scan flip-flop 402, the first scan flip-flop 402 is loaded with a logic '0'. During the launch pulse, the data input (Din) provides a logic '1' to the first scan flip-flop 402, the second scan flip-flop 404, and the third scan flip-flop 406. If the first scan flip-flop 402 is slow to rise but the second scan flip-flop 404 and the third scan flip-flop 406 are operating properly, the slow-to-rise fault of the first scan flip-flop 402 is masked by the presence of the logic '1' at the outputs of the second scan flip-flop 404 and the third scan flip-flop 406.

In launch-on-shift testing and in scan mode, during a shift pulse, test patterns are first loaded using the scan input signal (scan_in) into the first scan flip-flop 402, the second scan flip-flop 404, and the third scan flip-flop 406. During a last shift/launch pulse, the content of each of the first scan flip-flop 402, the second scan flip-flop 404, and the third scan flip-flop 406 is output at an output (Q). During a capture pulse, the output of the OR gate 320 is captured by the fourth scan flip-flop 410, which is then shifted out and compared with an expected output to determine whether the triple-voting flop 400 includes faults.

Disadvantageously, the launch-on-shift testing shown in FIG. 4 does not provide complete at-speed scan coverage (fault coverage of about 80%). For example, a slow-to-fall fault may be undetectable at the first scan flip-flop 402 during at-speed scan testing. In particular, during the shift pulse (to cause the output of the AND gate 310 to be a logic '1'), to test a slow-to-rise fault at the output of the first scan flip-flop 402, the first scan flip-flop 402 and the second scan flip-flop 404 are loaded with a logic '1'. During the last shift/launch pulse, the first scan flip-flop 402 is loaded with a logic '0', which causes the first scan flip-flop 402 to transition from a logic '1' to a logic '0' and the outputs of the second scan flip-flop 404 and the third scan flip-flop 406 to remain at logic '1'. This results in the output of the OR gate 320 remaining at a logic '1'. If the first scan flip-flop 402 is slow to fall but the second scan flip-flop 404 and the third scan flip-flop 406 are operating properly, the slow-to-fall fault of the first scan flip-flop 402 is masked and may be undetectable.

Figure 5:
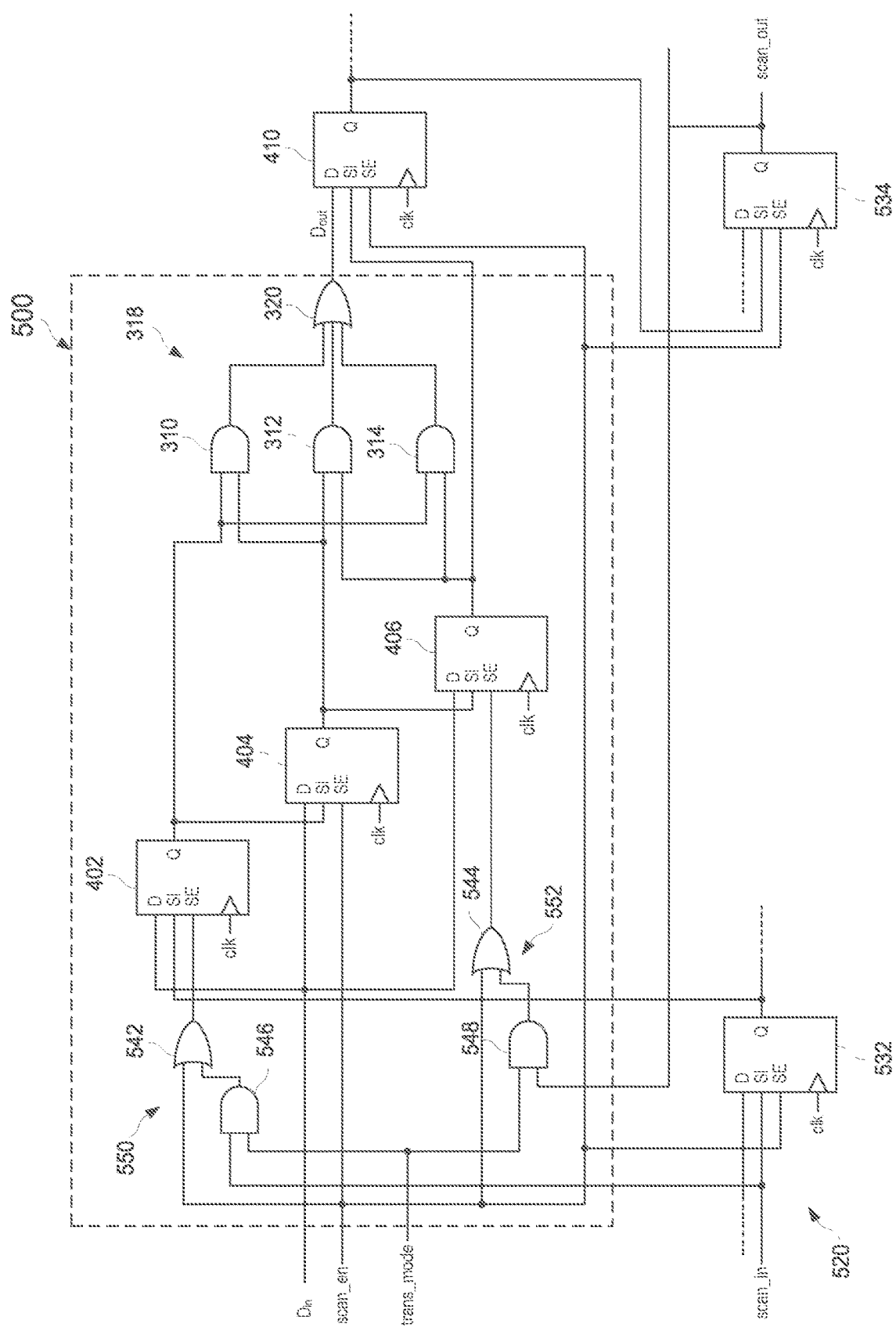
FIG. 5 is a schematic of a triple-voting flop using scan flip-flops.

FIG. 5 illustrates a schematic of a triple-voting flop 500 using scan flip-flops. Triple-voting flop 500 is structurally similar to triple-voting flop 400. However, triple-voting flop 500 additionally includes a first flip-flop 532, a second flip-flop 534, a first scan enable control circuit 550, and a second scan enable control circuit 552. The first scan enable control circuit 550 includes a first AND gate 546 and a first OR gate 542. The second scan enable control circuit 552 includes a second AND gate 548 and a second OR gate 544. The first scan flip-flop 402, the second scan flip-flop 404, the third scan flip-flop 406, and the fourth scan flip-flop 410 are coupled to form a portion of scan chain 520, which includes the first flip-flop 532 and the second flip-flop 534.

During normal operation, where triple-voting flop 500 operates similarly to the triple-voting flop 300, the scan enable signal (scan-en) and the trans-mode signal (trans_mode) are de-asserted (e.g., logic level low).

During the launch-on-capture testing and in scan mode, by keeping the trans-mode signal (trans_mode) de-asserted, the triple-voting flop 500 operates similarly to the triple-voting flop 400, as the scan enable input (SE) of each of the first scan flip-flop 402, the second scan flip-flop 404, the third scan flip-flop 406, and the fourth scan flip-flop 410 receives the scan enable signal (scan_en). However, when the trans-mode signal (trans_mode) is asserted (e.g., logic level high), the scan enable inputs (SE) of the first scan flip-flop 402 and the third scan flip-flop 406 are selectively controlled, respectively, based on the scan input (SI) of the first flip-flop 532 and the output (Q) of the second flip-flop 534. As such, the content of the first scan flip-flop 402, the second scan flip-flop 404, and the third scan flip-flop 406 are independently controlled using the trans-mode signal (trans_mode) to improve at-speed scan coverage.

Disadvantageously, the arrangement for improved at-speed scan coverage in FIG. 5 requires two additional OR gates and two additional AND gates for each triple-voting flop of the integrated circuit. Further, the creation of timing paths between (i) the scan in (SI) and scan enable (SE) and (ii) scan out (SO) to scan enable (SE) terminals of multiple scan flip-flops is required. Moreover, the solution requires that the test operate at frequencies corresponding to the at-speed functional frequency (e.g., 400 MHZ). In contrast, the conventional test frequency is typically at lower frequencies (e.g., 100 to 200 MHz), necessitating higher frequency test equipment.

Figure 6:
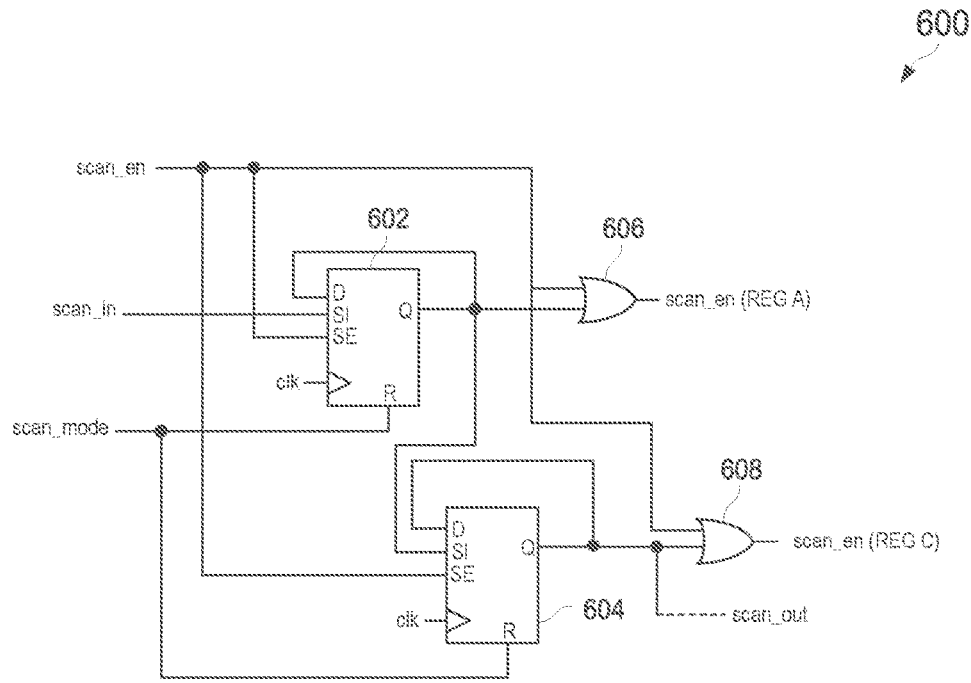
FIG. 6 is a schematic of an embodiment control circuit.
Figure 7:
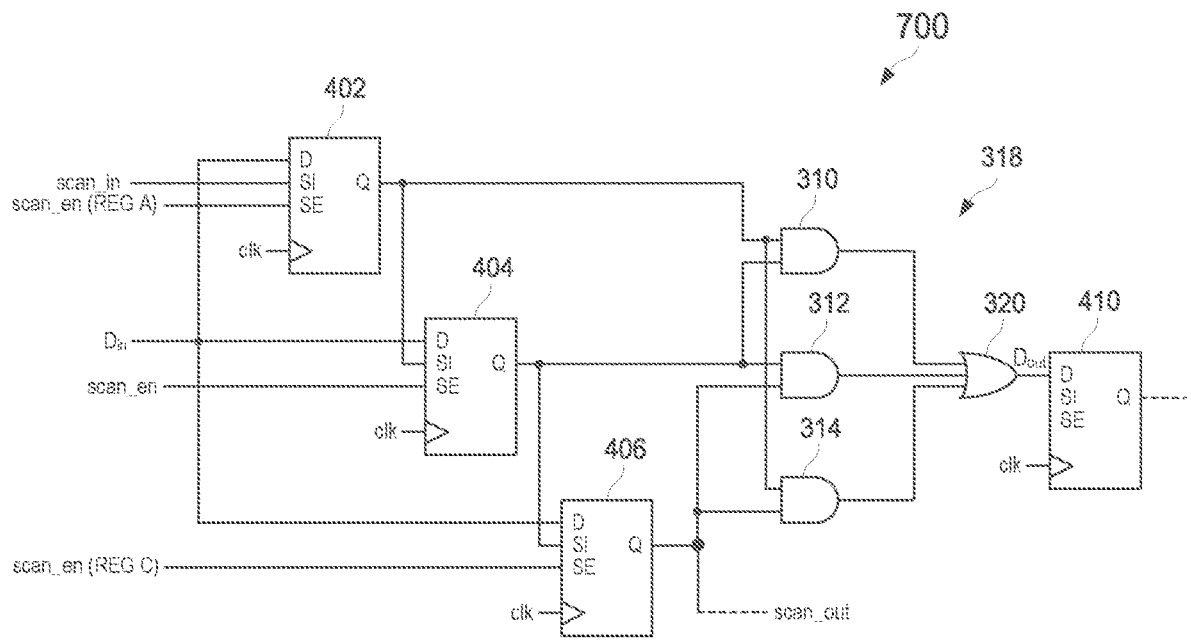
FIG. 7 is a schematic of an embodiment triple-voting flop of an integrated circuit using scan flip-flops.

FIG. 6 illustrates a schematic of an embodiment control circuit 600. FIG. 7 illustrates a schematic of an embodiment triple-voting flop 700 of an integrated circuit using scan flip-flops. In embodiments, the integrated circuit may include many triple-voting flops similar to the triple-voting flop 700. In embodiments, additional components (not shown) may be present between the output (Q) of the scan flip-flop and the scan-in input (SI) of the next scan flip-flop.

The control circuit 600 includes a first flip-flop 602, a second flip-flop 604, a first OR gate 606, and a second OR gate 608, which may (or may not) be arranged as shown. Control circuit 600 may include additional components not shown. The output (Q) of the first flip-flop 602 is coupled to a first input of the first OR gate 606 and a data input (D) of the first flip-flop 602 (i.e., constant). Likewise, the output (Q) of the second flip-flop 604 is coupled to a first input of the second OR gate 608 and a data input (D) of the second flip-flop 604. The second input of the first OR gate 606 and the second input of the second OR gate 608 are coupled to the scan enable signal (scan_en), which is also coupled to the scan enable input (SE) of the first flip-flop 602 and the scan enable input (SE) of the second flip-flop 604. The reset terminal (R) of the first flip-flop 602 and the reset terminal (R) of the second flip-flop 604 are coupled to the scan mode signal (scan_mode).

In embodiments, the output terminal of the first OR gate 606 is coupled to the scan enable input (SE) of the first scan flip-flop 402 of each triple-voting flop 700 of all scan chains in an integrated circuit. In embodiments, the output terminal of the second OR gate 608 is coupled to the scan enable input (SE) of the third scan flip-flop 406 of each triple-voting flop 700 of all scan chains in an integrated circuit. Thus, in embodiments, the first OR gate 606 and the second OR gate 608 are common to each triple-voting flop 700 of all scan chains in an integrated circuit.

In embodiments, the scan enable input (SE) of the second scan flip-flop 404 of each triple-voting flop 700 is coupled to the scan enable signal (scan_en).

In embodiments, the first flip-flop 602 is a scan flip-flop from a different scan chain. In embodiments, the first flip-flop 602 is a scan flip-flop from the same scan chain but of a scan flip-flop different from the first scan flip-flop 402, the second scan flip-flop 404, and the third scan flip-flop 406 of the triple-voting flop 700 being tested. In embodiments, the first flip-flop 602 is a non-scan flip-flop.

In embodiments, the second flip-flop 604 is a scan flip-flop from a different scan chain. In embodiments, the second flip-flop 604 is a scan flip-flop from the same scan chain but of a scan flip-flop different from the first scan flip-flop 402, second scan flip-flop 404, and the third scan flip-flop 406 of the triple-voting flop 700 being tested. In embodiments, the second flip-flop 604 is a non-scan flip-flop.

In embodiments, the first flip-flop 602 and the second flip-flop 604 are dedicated flip-flops common to each triple-voting flop 700 of all scan chains in an integrated circuit. In embodiments, the first flip-flop 602 and the second flip-flop 604 are existing controllability flip-flops. In embodiments, the first flip-flop 602 and the second flip-flop 604 can be of any clock domain.

In embodiments, a first flip-flop 602, a second flip-flop 604, a first OR gate 606, and a second OR gate 608 are added to the register transfer level (RTL). In such embodiments, the scan enable signal (scan_en) is coupled to the triple-voting flop 700 in scan insertion using scripts.

In embodiments where the test points added in the scan insertion are used as the first flip-flop 602 and the second flip-flop 604, a first OR gate 606 and a second OR gate 608 are added in scripts along with the scan enable signal (scan_en) being coupled to the triple-voting flop 700 in scan insertion using scripts.

In embodiments, the first scan flip-flop 402, the second scan flip-flop 404, and the third scan flip-flop 406, or a combination thereof, are from a different scan chain or a different position of the same scan chain. Thus, the first scan flip-flop 402, the second scan flip-flop 404, and the third scan flip-flop 406 in the triple-voting flop 700 are not required to be scan flip-flops within the same redundancy circuit.

Compared with the triple-voting flop 500 in FIG. 5, the triple-voting flop 700 in FIG. 7 has a lower area impact than the triple-voting flop 500. For example, if the triple-voting flop 500 is arranged where the first scan flip-flop 402, the second scan flip-flop 404, and the third scan flip-flop 406 are connected in the same scan chain or the second flip-flop 404 is a non-scan flip-flop and the third flip-flop 406 is scan-shadow of another functional flip-flop, each triple-voting flop 500 requires two AND gates and two OR gates. As another example, if the third scan flip-flop 406 is connected in a different scan chain than the first scan flip-flop 402 and the second scan flip-flop 404, each triple-voting flop 500 requires an AND gate and an OR gate. In contrast, a single control circuit 600 (i.e., first flip-flop 602, second flip-flop 604, first OR gate 606, and second OR gate 608) is provided for all triple-voting flops in an integrated circuit.

Advantageously, in embodiments, no scan chain reordering is required. In embodiments, the flip-flops in the triple-vote flop 700 are implemented in any way known in the art.

In embodiments, during normal operation, both the scan enable signal (scan_en) and the scan mode signal (scan_ mode) are de-asserted (e.g., logic level low). In such an embodiment, the triple-voting flop 700 operates similarly to the triple-voting flop 300.

In embodiments, during scan mode, the control circuit 600 implements launch-on-control testing for the triple-voting flop 700. In embodiments, when the scan mode signal (scan_mode) is de-asserted (e.g., logic level low), the scan enable input (SE) of the first scan flip-flop 402, the second scan flip-flop 404, and the third scan flip-flop 406 receives the scan enable signal (scan_en). In such an embodiment, the triple-voting flop 700 operates similarly to the triple-voting flop 400 with launch-on-control.

In embodiments, the scan enable input (SE) of each of the first scan flip-flop 402 and the third scan flip-flop 406 is selectively controlled based on the scan mode signal (scan_mode) being asserted (e.g., logic level high) at the reset input (R) of the first flip-flop 602 and the second flip-flop 604. The ability to selectively control the operation of the first scan flip-flop 402 and the third scan flip-flop 406 improves scan coverage compared to the scan coverage of the triple-vote flop 300, such that complete at-speed scan coverage is achieved (similar to the triple-vote flop 500), without the disadvantages.

For example, for at-speed testing using launch-on-control, to test a slow-to-rise fault at the output of the first scan flip-flop 402, during the shift pulses, the first scan flip-flop 402, the second scan flip-flop 404, and the third scan flip-flop 406 are loaded with a logic '0'.

Similarly, during the shift pulses, the first flip-flop 602 is loaded with a logic '0', while the scan mode signal (scan_mode) is asserted (e.g., logic level high). Further, the second flip-flop 604 is loaded with a logic '1', while the scan mode signal (scan_mode) is asserted (e.g., logic level high). Thus, during at-speed capture (i.e., during launch and capture pulses), the first flip-flop 602 and the second flip-flop 604, respectively, remain at a constant logic '0' and a constant logic '1', as their respective output (Q) is coupled back to the input (D) when their respective scan enable input (SE) is at a logic '0', which is driven from the scan enable signal (scan_en), which remains at a logic '0' during the launch-on-control for the at-speed capture. If the first flip-flop 602 and the second flip-flop 604 are non-scan flip-flops, then during the initial test setup (e.g., through Joint Test Action Group (JTAG) loading) and with the scan mode signal (scan_mode) being asserted (e.g., logic level high), the first flip-flop 602 and the second flip-flop 604, respectively are loaded with a logic '0' and a logic '1', respectively.

During the launch pulse, the scan enable input (SE) of the first scan flip-flop 402 and the scan enable input (SE) of the second scan flip-flop 404 are at a logic low, while the scan enable input (SE) of the third scan flip-flop 406 is at a logic high. Further, the data input (Din) provides a logic '1' to the first scan flip-flop 402, the second scan flip-flop 404, and the third scan flip-flop 406. As the scan enable input (SE) of the third scan flip-flop 406 is at a logic high, the output (Q) of the third scan flip-flop 406 remains at logic '0', while the output (Q) of the first scan flip-flop 402 and the output (Q) of the second scan flip-flop 404 transition from the logic low level to the logic high level. When the first scan flip-flop 402 is slow to rise, the fault is propagated to the output of the first AND gate 310. As the outputs of the second AND gate 312 and the third AND gate 314 are at a logic '0'—as the output of the third scan flip-flop 406 is at a logic '0'), the fault is then propagated to the output of the first OR gate 320, which is captured by the fourth scan flip-flop 410 during the capture pulse.

In embodiments, during transition testing, the scan enable signal (scan_en) is held static (i.e., kept at the same value). In such an embodiment, the scan enable signal (scan_en) may be held at a logic level high or at a logic level low, based on the different scan patterns (i.e., different states based on different scan patterns).

In embodiments, the scan enable signal (scan_en) at the scan enable input (SE) of the first scan flip-flop 402 (Reg A) from the first OR gate 606 and the scan enable signal (scan_en) at the scan enable input (SE) of the third scan flip-flop 406 (Reg C) from the second OR gate 608 remain at a logic level high or logic level low throughout capture when the scan enable signal (scan_en) at the scan enable input (SE) of the second scan flip-flop 404 (Reg B) is at logic level low.

In embodiments, triple-voting flop 700 is implemented as part of an integrated circuit. In some embodiments, the scan test of triple-voting flop 700 is performed using an ATE (e.g., during production testing of the integrated circuit). In some embodiments, the scan test of triple-voting flop 700 is performed using a logic built-in self-test (LBIST) controller.

In embodiments, scan test patterns can be designed (e.g., manually or with a conventional automated test pattern generator (ATPG)) to advantageously achieve up to 100% scan coverage for the triple-voting flop 700.

The triple-voting flop 700 and the control circuit 600 advantageously provide improved scan coverage without impacting the functional operating mode or scan-stitching. Some embodiments achieve improved scan coverage with low area impact (e.g., only 2 logic OR gates added for all triple-voting flops). In embodiments, the improved scan coverage of the triple-voting flop is achieved without routing fast signals (e.g., since the scan test is performed using launch-on-control, and thus, scan enable signal (scan_en) may be a relatively slow signal, and since the scan mode signal (scan_mode) may be a static signal during scan testing.)

In embodiments, a triple-voting flop with improved scan coverage may be implemented with a voting circuit that differs from voting circuit 318. For example, a voting circuit may be implemented using three OR gates having outputs coupled to an AND gate (not shown), where each OR gate has an input coupled to an output of a respective scan flip-flop. Thus, the implementation of the voting circuit is non-limiting.

Figure 8:
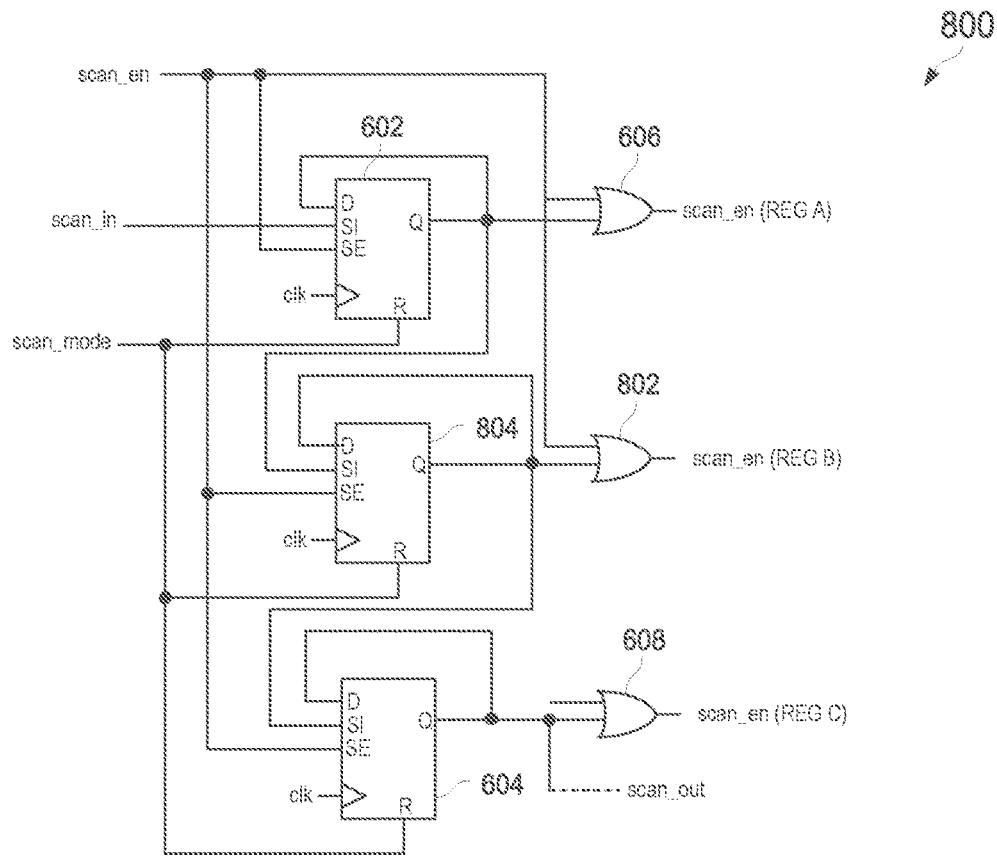
FIG. 8 is a schematic of an embodiment control circuit.
Figure 9:
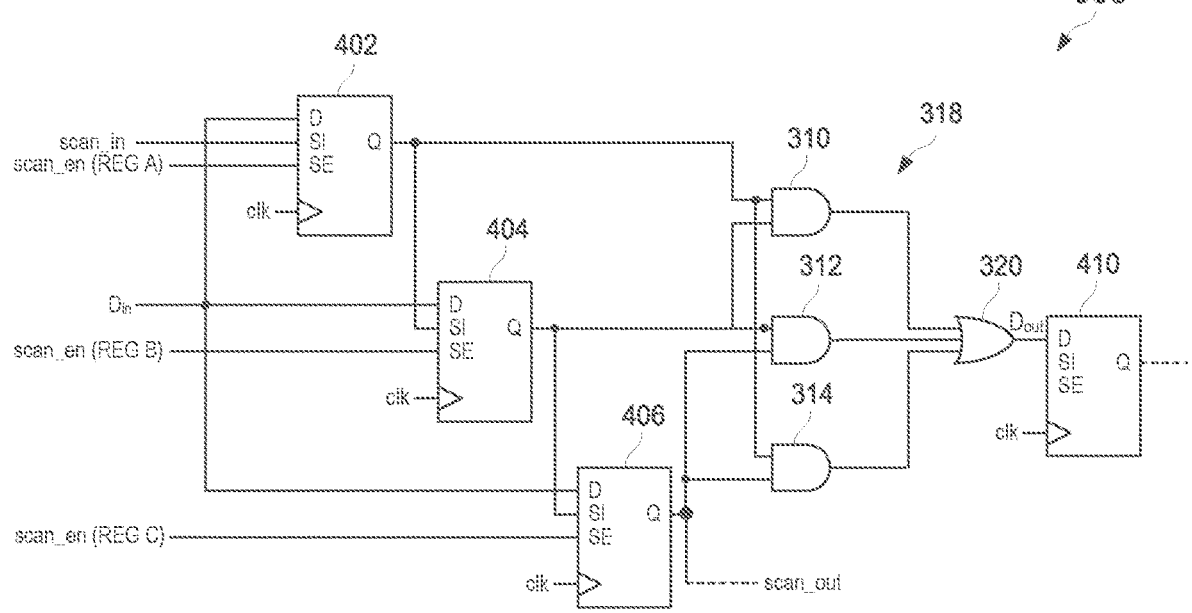
FIG. 9 is a schematic of an embodiment triple-voting flop of an integrated circuit using scan flip-flops.

FIG. 8 illustrates a schematic of an embodiment control circuit 800. FIG. 9 illustrates a schematic of an embodiment triple-voting flop 900 of an integrated circuit using scan flip-flops. In embodiments, the integrated circuit may include many triple-voting flops similar to the triple-voting flop 900.

The control circuit 800 includes a first flip-flop 602, a second flip-flop 604, a third scan flip-flop 804, a first OR gate 606, a second OR gate 608, and a third OR gate 802, which may (or may not) be arranged as shown. The control circuit 800 may include additional components not shown. Control circuit 800 is structurally similar to the control circuit 600. However, the control circuit 800 includes the third scan flip-flop 804 and the third OR gate 802.

The output (Q) of the third scan flip-flop 804 is coupled to a first input of the third OR gate 802 and a data input (D) of the third scan flip-flop 804. The second input of the third OR gate 802 is coupled to the scan enable signal (scan_en), which is also coupled to the scan enable input (SE) of the third scan flip-flop 804. The reset terminal (R) of the third scan flip-flop 804 is coupled to the scan mode signal (scan_mode).

The triple-voting flop 900 is structurally similar to the triple-voting flop 700. However, the second scan flip-flop 404 in the triple-voting flop 900 is coupled to the output of the third OR gate 802.

In embodiments, the output terminal of the third OR gate 802 is coupled to the scan enable input (SE) of the second scan flip-flop 404 of each triple-voting flop 900 of a scan chain in an integrated circuit. Thus, in embodiments, the first OR gate 606, the second OR gate 608, and the third OR gate 802 are common to each triple-voting flop 700 of all scan chains in an integrated circuit.

In embodiments, the third scan flip-flop 804 is a scan flip-flop from a different scan chain. In embodiments, the third scan flip-flop 804 is a scan flip-flop from the same scan chain but of a scan flip-flop different from the first scan flip-flop 402, the second scan flip-flop 404, and the third scan flip-flop 406 of the triple-voting flop 900 being tested. In embodiments, the third scan flip-flop 804 is a non-scan flip-flop.

In embodiments, the third scan flip-flop 804 is a dedicated flip-flop, common to each triple-voting flop 900 of all scan chains in an integrated circuit. In embodiments, the third scan flip-flop 804 is an existing controllability flip-flop. In embodiments, the third scan flip-flop 804 is of any clock domain.

In embodiments, a first flip-flop 602, a second flip-flop 604, a third scan flip-flop 804, a first OR gate 606, a second OR gate 608, and a third OR gate 802 are added to the register transfer level (RTL).

Figure 10:
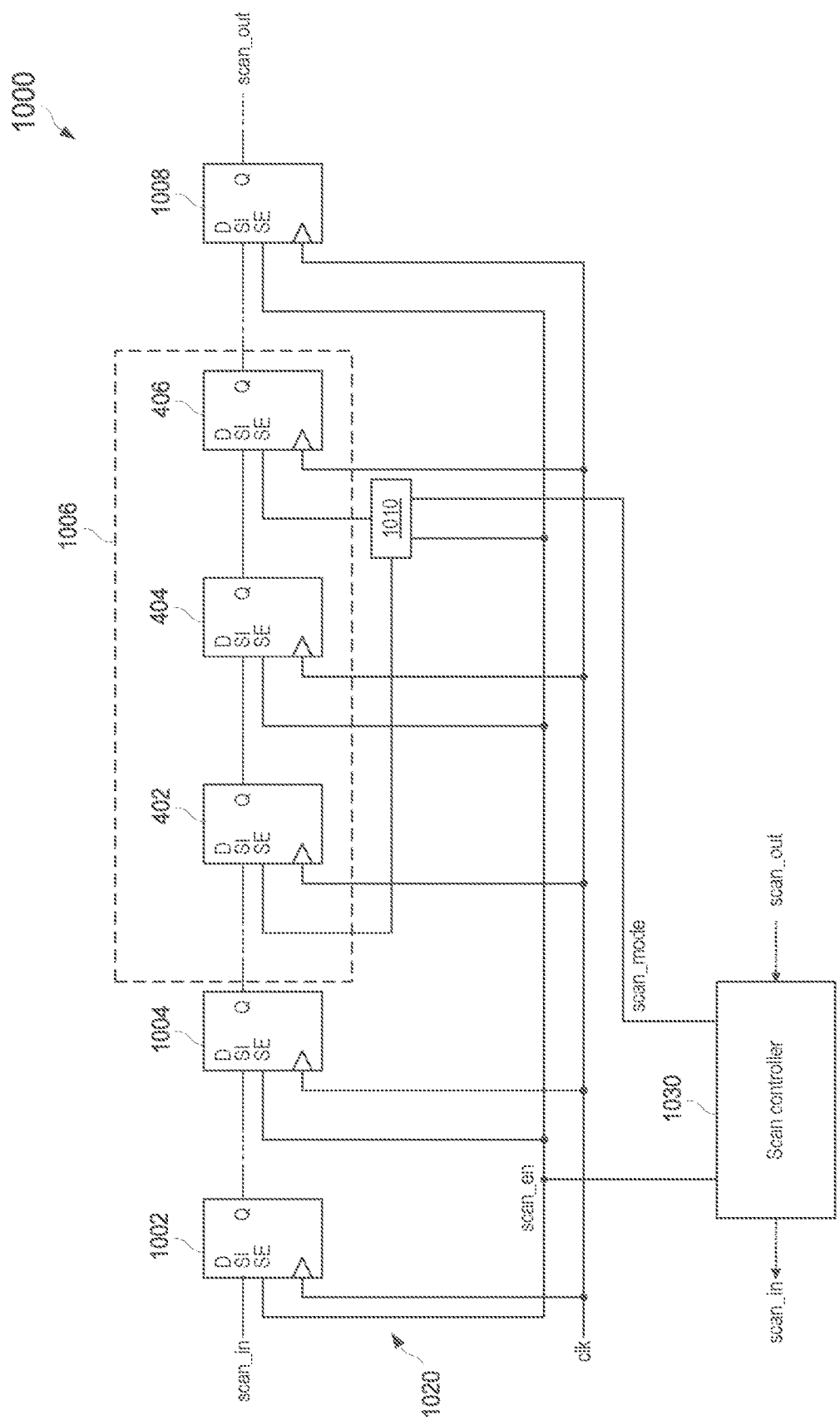
FIG. 10 is a schematic of an embodiment integrated circuit.

FIG. 10 illustrates a schematic of an embodiment integrated circuit 1000. Integrated circuit 1000 includes the scan chain 1020 and scan controller 1030. Scan chain 1020 includes the triple-voting flop 1006, scan flip-flops 1002, 1004, and 1008.

When a redundant circuit such as the triple-voting flop 1006 (with three flip-flops) replaces a single flip-flop of the scan chain 1020 (e.g., for redundancy), three scan shift cycles (i.e., two additional cycles) are typically required to shift the triple-voting flop 1006. Adding a scan shift cycle during the scan test impacts the load/unload and, thus, the scan test time. Further, the addition of the scan shift cycle impacts the self-test time when the integrated circuit 1000 is operating in-field within the LBIST partitions.

In embodiments, the triple-voting flop 1006 includes the control circuit 1010 (implemented as the control circuit 600), the first scan flip-flop 402, the second scan flip-flop 404, and the third scan flip-flop 406. In embodiments, triple-voting flop 1006 is implemented as the triple-voting flop 700.

In embodiments, the triple-voting flop 1006 includes the control circuit 1010 (implemented as the control circuit 800), the first scan flip-flop 402, the second scan flip-flop 404, and the third scan flip-flop 406. In embodiments, triple-voting flop 1006 is implemented as the triple-voting flop 900.

In some embodiments, the scan controller 1030 is implemented using digital circuits like a finite state machine (FSM). In embodiments, the scan controller 1030 is implemented with a generic or custom microcontroller or processor coupled to a memory. Other implementations may also be possible. In embodiments, the scan controller 1030 incorporates the control circuit 1010, which is common to all triple-voting flops in the integrated circuit 1000.

In embodiments, the control circuit 1010 receives the scan enable signal (scan_en) and a control signal from the scan output (SO) of a preceding scan flip-flop (i.e., coupled to the scan input of the control circuit 600) to control the scan enable input (SE) of the first scan flip-flop 402 and the scan enable input (SE) of the third scan flip-flop 406.

In embodiments, the control circuit 1010 receives the scan enable signal (scan_en) and a control signal from the scan output (SO) of another scan flip-flop (i.e., coupled to the scan input of the control circuit 600) of the scan chain 1020 (such as a scan flip-flop subsequent to triple-voting flop 1006 or a scan flip-flop preceding the triple-voting flop 1006) to control the scan enable input (SE) of the first scan flip-flop 402 and the scan enable input (SE) of the third scan flip-flop 406.

In embodiments, the scan controller 1030 performs LBIST by generating the scan mode signal (scan_mode), scan enable signal (scan_en), and scan in signal (scan_in); testing the triple-voting flop 1006 using launch-on-capture testing; receiving the output signal (scan_out); and determining whether the triple-voting flop 1006 suffers from any fault conditions.

In embodiments, an automated test equipment generates the scan mode signal (scan_mode), scan enable signal (scan_en), and scan in signal (scan_in); tests the triple-voting flop 1006 using launch-on-capture testing; receives the output signal (scan_out); and determines whether the triple-voting flop 1006 suffers from any fault conditions.

Figure 11:
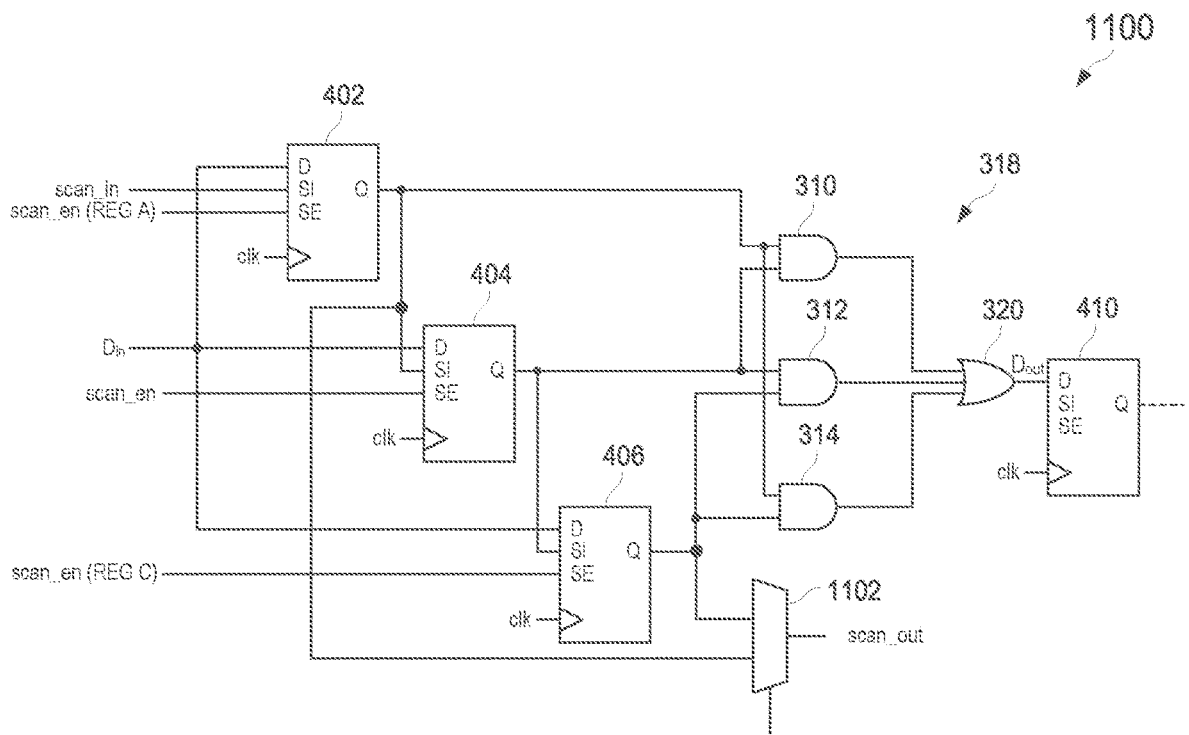
FIG. 11 is a schematic of an embodiment triple-voting flop of an integrated circuit using scan flip-flops.
Figure 12:
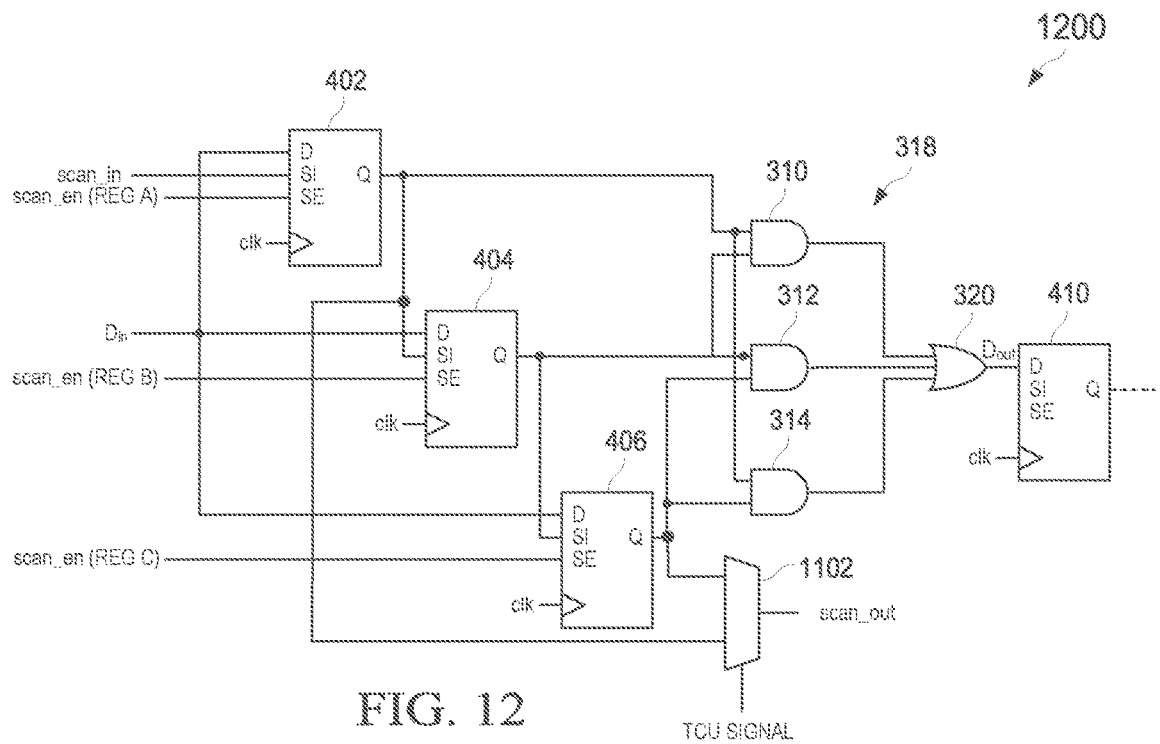
FIG. 12 is a schematic of an embodiment triple-voting flop of an integrated circuit using scan flip-flops.

FIG. 11 illustrates a schematic of an embodiment triple-voting flop 1100 of an integrated circuit using scan flip-flops. FIG. 12 illustrates a schematic of an embodiment triple-voting flop 1200 of an integrated circuit using scan flip-flops. Advantageously, the triple-voting flop 1100 and the triple-voting flop 1200 require a single shift cycle for testing—in contrast with the three-shift cycle required in conventional triple-voting flops.

Conventionally, to achieve 100% scan coverage, the first scan flip-flop 402 and the third scan flip-flop 406 are driven from functional flip-flops. The value of the functional flip-flops is not held during capture. Further, during LBIST testing, the second scan flip-flop 404 testing is limited due to the use of the non-scan flip-flops.

The triple-voting flop 1100 is coupled to the control circuit 600. The triple-voting flop 1200 is coupled to the control circuit 800. Triple-voting flop 1100 and triple-voting flop 1200 are structurally similar to triple-voting flop 700 and triple-voting flop 900, respectively. However, a scan out signal (scan_out) is provided at the output (Q) of the first scan flip-flop 402 in the triple-voting flop 1100 and the triple-voting flop 1200.

In embodiments, optionally, the triple-voting flop 1100 and the triple-voting flop 1200 include a multiplexer 1102. The input terminals of the multiplexer 1102 are coupled to the output (Q) of the first scan flip-flop 402 and the output (Q) of the third scan flip-flop 406. The select terminal of the multiplexer 1102 is coupled to the test control unit (TCU), which provides a test control signal (TCU SIGNAL) to determine the selection between the inputs of the multiplexer 1102 as an output of the multiplexer 1102. The multiplexer 1102 coupled to the output (Q) of the first scan flip-flop 402 and the third scan flip-flop 406 provides flexibility for three scan shift cycles with test patterns generated for, for example, basic mode testing and single shift cycle for test patterns generated for, for example, fast sequential or full sequential testing.

In embodiments, the second scan flip-flop 404 and the third scan flip-flop 406 can be forced to be non-scan flip-flops during scan insertion and connected through scripts by, for example, coupling the scan input (SI) and scan enable input (SE) of the second scan flip-flop 404 and the third scan flip-flop 406 through scripts. As such, the second scan flip-flop 404 and the third scan flip-flop 406 are controllable through a respective scan in signal (e.g., scan_in1 for the second scan flip-flop 404 and scan_in2 for the third scan flip-flop 406). Advantageously, this allows for LBIST testing as the triple-voting flop 1100 and the triple-voting flop 1200 do not include non-scan flip flops because the second scan flip-flop 404 and the third scan flip-flop 406 have a known value at the end of the last shift are not part of the scan out signal (scan_out). Moreover, this removes any requirement for the third scan flip-flop 406 to be a shadow of an external functional flip-flop as required in conventional solutions.

Figure 13:
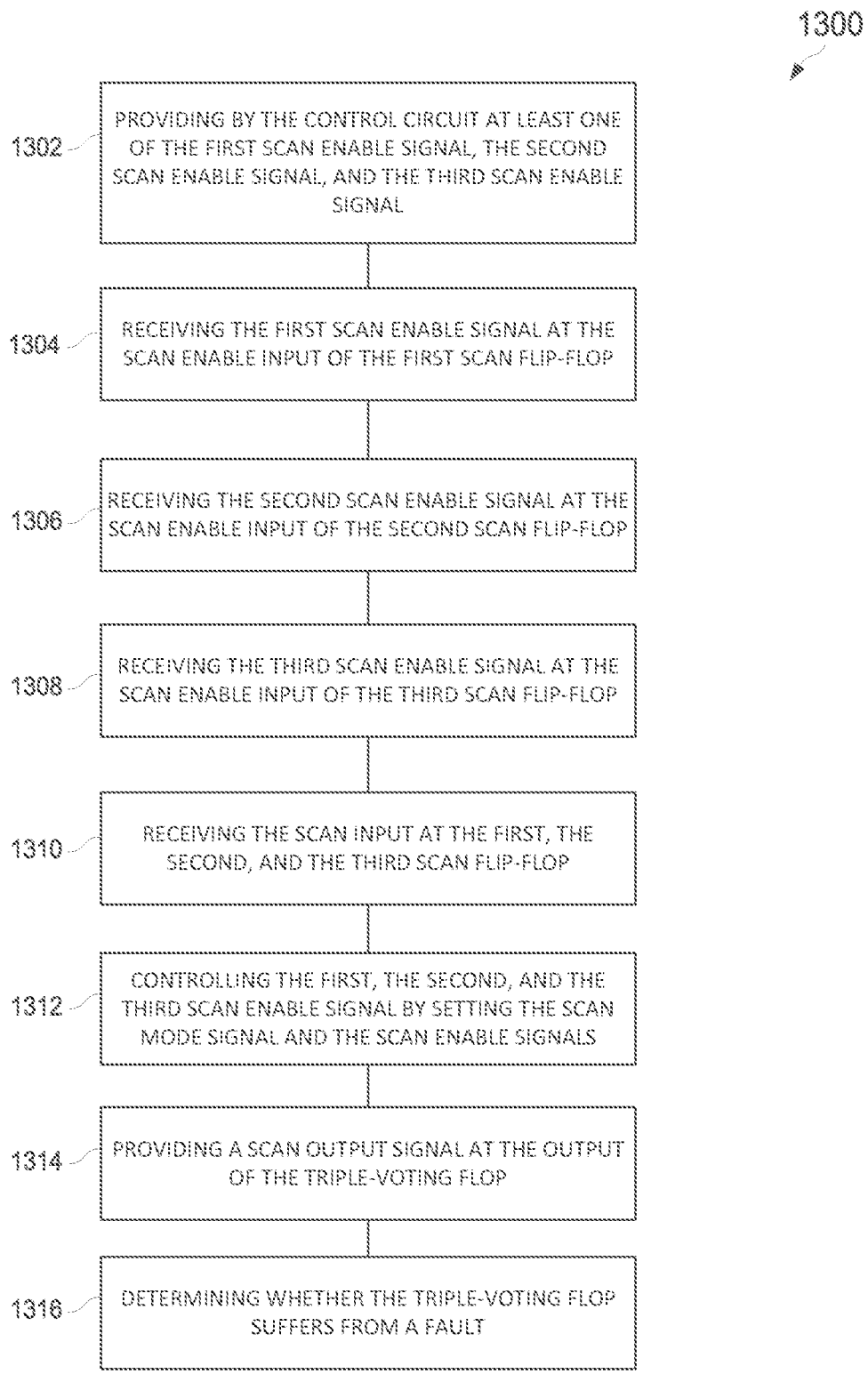
FIG. 13 is a flow chart of an embodiment method for testing a triple-voting flop in a scan chain of an integrated circuit.

FIG. 13 illustrates a flow chart of an embodiment method 1300 for testing a triple-voting flop in a scan chain 1020 of an integrated circuit 1000. It is noted that all steps outlined in the flow chart of method 1300 are not necessarily required and can be optional. Further, changes to the arrangement of the steps, removal of one or more steps and path connections, and addition of steps and path connections are similarly contemplated.

At step 1302, the control circuit 600, 800, 1010 provides a first scan enable signal (scan_en (REG A)), a second scan enable signal (scan_en (REG B)), and a third scan enable signal (scan_en (REG C)). In embodiments, the control circuit 600, 800, 1010 only provides the first scan enable signal (scan_en (REG A)) and the third scan enable signal (scan_en (REG C)).

At step 1304, the first scan flip-flop 402 receives the first scan enable signal at the scan enable input (SE) of the first scan flip-flop 402. At step 1306, the second scan flip-flop 404 receives the second scan enable signal at the scan enable input (SE) of the second scan flip-flop 404. At step 1308, the third scan flip-flop 406 receives the third scan enable signal at the scan enable input (SE) of the third scan flip-flop 406.

At step 1310, a scan input signal is provided to the first scan flip-flop, the second scan flip-flop, and the third scan flip-flop.

At step 1312, the scan controller 1030 controls the first scan enable signal, the second scan enable signal, and the third scan enable signal by setting the scan mode signal (scan_mode) and the scan enable signals.

At step 1314, a scan output signal is provided at the output of the triple-voting flop.

At step 1316, the scan controller (or a separate processor) determines whether the triple-voting flop suffers from a fault based on the scan output signal and the asserting and de-asserting of the first scan enable signal, the second scan enable signal, and the third scan enable signal. In embodiments, determining a fault includes verifying that all rising and falling transitions of each output node of the triple-voting flop occur within a predetermined time.

In embodiments, steps 1302 to 1316 are repeated for a second triple-voting flop of the same or different scan chain 1020.

A first aspect relates to an integrated circuit. The integrated circuit includes a control circuit and a triple-voting flop. The control circuit includes a first flip-flop, a second flip-flop, a first OR gate, and a second OR gate. An output of each flip-flop is coupled to its respective input. A reset terminal of each flip-flop is configured to receive a scan mode signal. A scan in terminal of the first flip-flop is configured to receive a scan in signal. A first input of the first OR gate is coupled to the output of the first flip-flop. A second input of the first OR gate is coupled to a scan enable signal. A first input of the second OR gate is coupled to the output of the second flip-flop. A second input of the second OR gate is coupled to the scan enable signal. And, the output of the first flip-flop is coupled to scan in terminal of the second flip-flop. The triple-voting flop includes N number of scan flip-flops, N being an odd number greater than or equal to 3. The N scan flip-flops include a first scan flip-flop, a second scan flip-flop, and a third scan flip-flop. The first scan flip-flop has an output coupled to a scan input of the second scan flip-flop and a scan enable input coupled to an output terminal of the first OR gate of the control circuit. The third scan flip-flop has a scan input coupled to an output of the second scan flip-flop and a scan enable input coupled to an output terminal of the second OR gate of the control circuit. The control circuit configured to control the scan enable input of the first scan flip-flop and the scan enable input of the third scan flip-flop based on the scan enable signal and the scan mode signal.

In a first implementation form of the integrated circuit as such, the triple-voting flop is a first triple-voting flop of a scan chain. The integrated circuit further includes a second triple-voting flop comprising M number of scan flip-flops, M being an odd number greater than or equal to 3. The M scan flip-flops include a fourth scan flip-flop, a fifth scan flip-flop, and a sixth scan flip-flop. The fourth scan flip-flop has an output coupled to a scan input of the fifth scan flip-flop and a scan enable input coupled to the output terminal of the first OR gate of the control circuit. The sixth scan flip-flop has a scan input coupled to an output of the fifth scan flip-flop and a scan enable input coupled to the output terminal of the second OR gate of the control circuit. The control circuit is configured to control the scan enable input of the fourth scan flip-flop and the scan enable input of the sixth scan flip-flop based on the scan enable signal and the scan mode signal.

In a second implementation form of the integrated circuit, according to the first aspect as such or any preceding implementation of the first aspect, the integrated circuit further includes a logic circuit comprising a first AND gate, a second AND gate, a third AND gate, and a third OR gate. A first input of the first AND gate is coupled to an output of the first scan flip-flop. A second input of the first AND gate is coupled to an output of the second scan flip-flop. A first input of the second AND gate is coupled to the output of the second scan flip-flop. A second input of the second AND gate is coupled to an output of the third scan flip-flop. A first input of the third AND gate is coupled to the output of the first scan flip-flop. A second input of the third AND gate is coupled to the output of the third scan flip-flop. A first input terminal of the third OR gate is coupled to an output of the first AND gate. A second input terminal of the third OR gate is coupled to an output of the second AND gate. And, a third input terminal of the third OR gate is coupled to an output of the third AND gate.

In a third implementation form of the integrated circuit, according to the first aspect as such or any preceding implementation of the first aspect, the integrated circuit further includes a fourth scan flip-flop having an input coupled to an output of the third OR gate.

In a fourth implementation form of the integrated circuit, according to the first aspect as such or any preceding implementation of the first aspect, the integrated circuit further includes a scan controller coupled to the control circuit and the triple-voting flop. In response to the integrated circuit being in scan mode, the scan controller is configured to provide a scan input signal to the triple-voting flop, receive a scan output signal from the fourth scan flip-flop, and determine whether the triple-voting flop suffers from a fault based on the scan output signal.

In a fifth implementation form of the integrated circuit, according to the first aspect as such or any preceding implementation of the first aspect, N equals 3.

In a sixth implementation form of the integrated circuit, according to the first aspect as such or any preceding implementation of the first aspect, the first flip-flop and the second flip-flop are of the scan flip-flop type.

A second aspect relates to an integrated circuit. The integrated circuit includes a control circuit, a triple-voting flop, a scan chain, and a scan controller. The control circuit is configured to provide a first scan enable signal and a second scan enable signal. The triple-voting flop includes a first scan flip-flop, a second scan flip-flop, and a third scan flip-flop. An output of the first scan flip-flop is coupled to a scan input of the second scan flip-flop. An output of the second scan flip-flop is coupled to a scan input of the third scan flip-flop. The scan chain is configured to receive the first scan enable signal, the second scan enable signal, and a third scan enable signal. The scan chain includes the first scan flip-flop, the second scan flip-flop, and the third scan flip-flop. The first scan flip-flop is configured to receive the first scan enable signal. The second scan flip-flop is configured to receive the third scan enable signal. And, the third scan flip-flop is configured to receive the second scan enable signal. The scan controller is coupled to the control circuit and the triple-voting flop. The scan controller is configured to control the first scan enable signal, the second scan enable signal, and the third scan enable signal.

In a first implementation form of the integrated circuit as such, the triple-voting flop includes a logic circuit having a first AND gate, a second AND gate, a third AND gate, and an OR gate. A first input of the first AND gate is coupled to an output of the first scan flip-flop, a second input of the first AND gate is coupled to an output of the second scan flip-flop, a first input of the second AND gate is coupled to the output of the second scan flip-flop, a second input of the second AND gate is coupled to an output of the third scan flip-flop, a first input of the third AND gate is coupled to the output of the first scan flip-flop, a second input of the third AND gate is coupled to the output of the third scan flip-flop, a first input terminal of the OR gate is coupled to an output of the first AND gate, a second input terminal of the OR gate is coupled to an output of the second AND gate, and a third input terminal of the OR gate is coupled to an output of the third AND gate.

In a second implementation form of the integrated circuit, according to the second aspect as such or any preceding implementation of the second aspect, the integrated circuit further includes a fourth scan flip-flop having an input coupled to an output of the OR gate.

In a third implementation form of the integrated circuit, according to the second aspect as such or any preceding implementation of the second aspect, in response to the integrated circuit being in scan mode, the scan controller is configured to provide a scan input signal to the triple-voting flop, receive a scan output signal from the fourth scan flip-flop, and determine whether the triple-voting flop suffers from a fault based on the scan output signal.

In a fourth implementation form of the integrated circuit, according to the second aspect as such or any preceding implementation of the second aspect, the triple-voting flop is a first triple-voting flop, and the scan chain further includes a second triple-voting flop.

In a fifth implementation form of the integrated circuit, according to the second aspect as such or any preceding implementation of the second aspect, the integrated circuit further includes a multiplexer. A first input of the multiplexer is coupled to the output of the first scan flip-flop, and a second input of the multiplexer is coupled to an output of the third scan flip-flop.

In a sixth implementation form of the integrated circuit, according to the second aspect as such or any preceding implementation of the second aspect, the scan controller is configured to, in scan mode, determine whether the triple-voting flop suffers from a fault by controlling the first scan enable signal, the second scan enable signal, and the third scan enable signal.

A third aspect relates to a method for testing a triple-voting flop in a scan chain of an integrated circuit. The method includes providing, by a control circuit of the integrated circuit, a first scan enable signal and a second scan enable signal; receiving, by a first scan flip-flop of the triple-voting flop, the first scan enable signal; receiving, by a second scan flip-flop of the triple-voting flop, a third scan enable signal, an output of the first scan flip-flop coupled to a scan input of the second scan flip-flop; receiving, by a third scan flip-flop of the triple-voting flop, the second scan enable signal, an output of the second scan flip-flop coupled to a scan input of the third scan flip-flop; providing a scan input signal to the first scan flip-flop, the second scan flip-flop, and the third scan flip-flop; controlling, by a scan controller of the integrated circuit, the first scan enable signal, the second scan enable signal, and the third scan enable signal; receiving, at an output of the triple-voting flop, a scan output signal; and determining whether the triple-voting flop suffers from a fault based on the scan output signal and the controlling of the first scan enable signal, the second scan enable signal, and the third scan enable signal.

In a first implementation form of the method as such, determining whether the triple-voting flop suffers from a fault comprises verifying that all rising and falling transitions of each output node of the triple-voting flop occur within a predetermined time.

In a second implementation form of the method, according to the third aspect as such or any preceding implementation of the third aspect, the triple-voting flop includes a logic circuit having a first AND gate, a second AND gate, a third AND gate, and an OR gate. A first input of the first AND gate is coupled to an output of the first scan flip-flop, a second input of the first AND gate is coupled to an output of the second scan flip-flop, a first input of the second AND gate is coupled to the output of the second scan flip-flop, a second input of the second AND gate is coupled to an output of the third scan flip-flop, a first input of the third AND gate is coupled to the output of the first scan flip-flop, a second input of the third AND gate is coupled to the output of the third scan flip-flop, a first input terminal of the OR gate is coupled to an output of the first AND gate, a second input terminal of the OR gate is coupled to an output of the second AND gate, and a third input terminal of the OR gate is coupled to an output of the third AND gate.

In a third implementation form of the method, according to the third aspect as such or any preceding implementation of the third aspect, an output of the OR gate is coupled to a fourth scan flip-flop. In response to the integrated circuit being in scan mode, the method further includes transmitting the scan input signal to the triple-voting flop and receiving the scan output signal from the fourth scan flip-flop.

In a fourth implementation form of the method, according to the third aspect as such or any preceding implementation of the third aspect, the triple-voting flop is a first triple-voting flop, and the scan chain further includes a second triple-voting flop.

In a fifth implementation form of the method, according to the third aspect as such or any preceding implementation of the third aspect, the method further includes receiving, by a first scan flip-flop of the second triple-voting flop, the first scan enable signal; receiving, by a second scan flip-flop of the second triple-voting flop, a third scan enable signal; receiving, by a third scan flip-flop of the second triple-voting flop, the second scan enable signal; providing a scan input signal to the first scan flip-flop, the second scan flip-flop, and the third scan flip-flop of the second triple-voting flop; controlling, by a scan controller of the integrated circuit, the first scan enable signal, the second scan enable signal, and the third scan enable signal; receiving, at an output of the second triple-voting flop, a second scan output signal; and determining whether the second triple-voting flop suffers from a fault based on the second scan output signal and the controlling of the first scan enable signal, the second scan enable signal, and the third scan enable signal. An output of the first scan flip-flop of the second triple-voting flop is coupled to a scan input of the second scan flip-flop of the second triple-voting flop. An output of the second scan flip-flop of the second triple-voting flop is coupled to a scan input of the third scan flip-flop of the second triple-voting flop Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. An integrated circuit comprising:
   a control circuit comprising a first flip-flop, a second flip-flop, a first OR gate, and a second OR gate, an output of each flip-flop coupled to its respective input, a reset terminal of each flip-flop configured to receive a scan mode signal, a scan in terminal of the first flip-flop configured to receive a scan in signal, a first input of the first OR gate coupled to the output of the first flip-flop, a second input of the first OR gate coupled to a scan enable signal, a first input of the second OR gate coupled to the output of the second flip-flop, a second input of the second OR gate coupled to the scan enable signal, and the output of the first flip-flop coupled to scan in terminal of the second flip-flop; and
   a triple-voting flop comprising N number of scan flip-flops, N being an odd number greater than or equal to 3, the N scan flip-flops comprising a first scan flip-flop, a second scan flip-flop, and a third scan flip-flop, the first scan flip-flop having an output coupled to a scan input of the second scan flip-flop and a scan enable input coupled to an output terminal of the first OR gate of the control circuit, the third scan flip-flop having a scan input coupled to an output of the second scan flip-flop and a scan enable input coupled to an output terminal of the second OR gate of the control circuit, the control circuit configured to control the scan enable input of the first scan flip-flop and the scan enable input of the third scan flip-flop based on the scan enable signal and the scan mode signal.

2. The integrated circuit of claim 1, wherein the triple-voting flop is a first triple-voting flop of a scan chain, the integrated circuit further comprising a second triple-voting flop comprising M number of scan flip-flops, M being an odd number greater than or equal to 3, the M scan flip-flops comprising a fourth scan flip-flop, a fifth scan flip-flop, and a sixth scan flip-flop, the fourth scan flip-flop having an output coupled to a scan input of the fifth scan flip-flop and a scan enable input coupled to the output terminal of the first OR gate of the control circuit, the sixth scan flip-flop having a scan input coupled to an output of the fifth scan flip-flop and a scan enable input coupled to the output terminal of the second OR gate of the control circuit, the control circuit configured to control the scan enable input of the fourth scan flip-flop and the scan enable input of the sixth scan flip-flop based on the scan enable signal and the scan mode signal.

3. The integrated circuit of claim 1, further comprising a logic circuit comprising a first AND gate, a second AND gate, a third AND gate, and a third OR gate, a first input of the first AND gate coupled to an output of the first scan flip-flop, a second input of the first AND gate coupled to an output of the second scan flip-flop, a first input of the second AND gate coupled to the output of the second scan flip-flop, a second input of the second AND gate coupled to an output of the third scan flip-flop, a first input of the third AND gate coupled to the output of the first scan flip-flop, a second input of the third AND gate coupled to the output of the third scan flip-flop, a first input terminal of the third OR gate coupled to an output of the first AND gate, a second input terminal of the third OR gate coupled to an output of the second AND gate, and a third input terminal of the third OR gate coupled to an output of the third AND gate.

4. The integrated circuit of claim 3, further comprising a fourth scan flip-flop having an input coupled to an output of the third OR gate.

5. The integrated circuit of claim 4, further comprising a scan controller coupled to the control circuit and the triple-voting flop, wherein, in response to the integrated circuit being in scan mode, the scan controller is configured to provide a scan input signal to the triple-voting flop, receive a scan output signal from the fourth scan flip-flop, and determine whether the triple-voting flop suffers from a fault based on the scan output signal.

6. The integrated circuit of claim 1, wherein N equals 3.

7. The integrated circuit of claim 1, wherein the first flip-flop and the second flip-flop are of the scan flip-flop type.

8. An integrated circuit comprising:
   a control circuit configured to provide a first scan enable signal and a second scan enable signal;
   a triple-voting flop comprising a first scan flip-flop, a second scan flip-flop, and a third scan flip-flop, an output of the first scan flip-flop coupled to a scan input of the second scan flip-flop, and an output of the second scan flip-flop coupled to a scan input of the third scan flip-flop;
   a scan chain configured to receive the first scan enable signal, the second scan enable signal, and a third scan enable signal, the scan chain comprising the first scan flip-flop, the second scan flip-flop, and the third scan flip-flop, the first scan flip-flop configured to receive the first scan enable signal, the second scan flip-flop configured to receive the third scan enable signal, and the third scan flip-flop configured to receive the second scan enable signal; and a scan controller coupled to the control circuit and the triple-voting flop, the scan controller configured to control the first scan enable signal, the second scan enable signal, and the third scan enable signal.

9. The integrated circuit of claim 8, wherein the triple-voting flop comprises a logic circuit comprising a first AND gate, a second AND gate, a third AND gate, and an OR gate, a first input of the first AND gate coupled to an output of the first scan flip-flop, a second input of the first AND gate coupled to an output of the second scan flip-flop, a first input of the second AND gate coupled to the output of the second scan flip-flop, a second input of the second AND gate coupled to an output of the third scan flip-flop, a first input of the third AND gate coupled to the output of the first scan flip-flop, a second input of the third AND gate coupled to the output of the third scan flip-flop, a first input terminal of the OR gate coupled to an output of the first AND gate, a second input terminal of the OR gate coupled to an output of the second AND gate, and a third input terminal of the OR gate coupled to an output of the third AND gate.

10. The integrated circuit of claim 9, further comprising a fourth scan flip-flop having an input coupled to an output of the OR gate.

11. The integrated circuit of claim 10, wherein, in response to the integrated circuit being in scan mode, the scan controller is configured to provide a scan input signal to the triple-voting flop, receive a scan output signal from the fourth scan flip-flop, and determine whether the triple-voting flop suffers from a fault based on the scan output signal.

12. The integrated circuit of claim 8, wherein the triple-voting flop is a first triple-voting flop, and the scan chain further comprising a second triple-voting flop.

13. The integrated circuit of claim 8, further comprising a multiplexer, a first input of the multiplexer coupled to the output of the first scan flip-flop, and a second input of the multiplexer coupled to an output of the third scan flip-flop.

14. The integrated circuit of claim 13, wherein the scan controller is configured to, in scan mode, determine whether the triple-voting flop suffers from a fault by controlling the first scan enable signal, the second scan enable signal, and the third scan enable signal.

15. A method for testing a triple-voting flop in a scan chain of an integrated circuit, the method comprising:
providing, by a control circuit of the integrated circuit, a first scan enable signal and a second scan enable signal;
receiving, by a first scan flip-flop of the triple-voting flop, the first scan enable signal;
receiving, by a second scan flip-flop of the triple-voting flop, a third scan enable signal, an output of the first scan flip-flop coupled to a scan input of the second scan flip-flop;
receiving, by a third scan flip-flop of the triple-voting flop, the second scan enable signal, an output of the second scan flip-flop coupled to a scan input of the third scan flip-flop;
providing a scan input signal to the first scan flip-flop, the second scan flip-flop, and the third scan flip-flop;
controlling, by a scan controller of the integrated circuit, the first scan enable signal, the second scan enable signal, and the third scan enable signal;

receiving, at an output of the triple-voting flop, a scan output signal; and
determining whether the triple-voting flop suffers from a fault based on the scan output signal and the controlling of the first scan enable signal, the second scan enable signal, and the third scan enable signal.

16. The method of claim 15, wherein determining whether the triple-voting flop suffers from a fault comprises verifying that all rising and falling transitions of each output node of the triple-voting flop occur within a predetermined time.

17. The method of claim 15, wherein the triple-voting flop comprises a logic circuit comprising a first AND gate, a second AND gate, a third AND gate, and an OR gate, a first input of the first AND gate coupled to an output of the first scan flip-flop, a second input of the first AND gate coupled to an output of the second scan flip-flop, a first input of the second AND gate coupled to the output of the second scan flip-flop, a second input of the second AND gate coupled to an output of the third scan flip-flop, a first input of the third AND gate coupled to the output of the first scan flip-flop, a second input of the third AND gate coupled to the output of the third scan flip-flop, a first input terminal of the OR gate coupled to an output of the first AND gate, a second input terminal of the OR gate coupled to an output of the second AND gate, and a third input terminal of the OR gate coupled to an output of the third AND gate.

18. The method of claim 17, wherein an output of the OR gate is coupled to a fourth scan flip-flop, and wherein, in response to the integrated circuit being in scan mode, the method further comprises:
transmitting the scan input signal to the triple-voting flop; and
receiving the scan output signal from the fourth scan flip-flop.

19. The method of claim 15, wherein the triple-voting flop is a first triple-voting flop, and the scan chain further comprises a second triple-voting flop.

20. The method of claim 19, further comprising:
receiving, by a first scan flip-flop of the second triple-voting flop, the first scan enable signal;
receiving, by a second scan flip-flop of the second triple-voting flop, a third scan enable signal, an output of the first scan flip-flop of the second triple-voting flop coupled to a scan input of the second scan flip-flop of the second triple-voting flop;
receiving, by a third scan flip-flop of the second triple-voting flop, the second scan enable signal, an output of the second scan flip-flop of the second triple-voting flop coupled to a scan input of the third scan flip-flop of the second triple-voting flop;
providing a scan input signal to the first scan flip-flop, the second scan flip-flop, and the third scan flip-flop of the second triple-voting flop;
controlling, by a scan controller of the integrated circuit, the first scan enable signal, the second scan enable signal, and the third scan enable signal;
receiving, at an output of the second triple-voting flop, a second scan output signal; and
determining whether the second triple-voting flop suffers from a fault based on the second scan output signal and the controlling of the first scan enable signal, the second scan enable signal, and the third scan enable signal.

* * * * *